United States Patent [19]
Chida

[11] Patent Number: 5,898,615
[45] Date of Patent: Apr. 27, 1999

[54] SEMICONDUCTOR MEMORY DEVICE HAVING NON-VOLATILE MEMORY CELLS CONNECTED IN SERIES

[75] Inventor: Tetsuya Chida, Kawasaki, Japan

[73] Assignee: Fujitsu Limited, Kawasaki, Japan

[21] Appl. No.: 08/905,217

[22] Filed: Aug. 1, 1997

[30] Foreign Application Priority Data

Mar. 19, 1997 [JP] Japan .................................. 9-066483

[51] Int. Cl.⁶ .................................................. G11C 7/00
[52] U.S. Cl. .............................. 365/185.17; 365/185.05; 365/185.09; 365/200
[58] Field of Search ....................... 365/185.17, 185.09, 365/185.05, 200

[56] References Cited

U.S. PATENT DOCUMENTS

| | | | |
|---|---|---|---|
| 5,043,942 | 8/1991 | Iwata et al. ............................. | 365/185 |
| 5,179,427 | 1/1993 | Nakayama et al. ..................... | 257/211 |
| 5,295,096 | 3/1994 | Nakajima ................................ | 365/185 |
| 5,300,799 | 4/1994 | Nakamura et al. ..................... | 257/295 |
| 5,303,182 | 4/1994 | Nakao et al. ........................... | 365/145 |
| 5,345,415 | 9/1994 | Nakao et al. ........................... | 365/145 |
| 5,392,238 | 2/1995 | Kirisawa ................................. | 365/185 |
| 5,452,249 | 9/1995 | Miyamoto et al. ..................... | 365/185 |
| 5,464,998 | 11/1995 | Hayakawa et al. ..................... | 257/316 |
| 5,508,957 | 4/1996 | Momodomi et al. .................. | 365/185.17 |
| 5,521,865 | 5/1996 | Ohuchi et al. ......................... | 365/185.22 |
| 5,523,980 | 6/1996 | Sakui et al. ............................ | 365/230.08 |
| 5,557,568 | 9/1996 | Miyamoto et al. .................... | 365/185.22 |
| 5,570,315 | 10/1996 | Tanaka et al. ......................... | 365/185.22 |
| 5,606,527 | 2/1997 | Kwack et al. .................. | 365/185.17 X |
| 5,677,873 | 10/1997 | Choi et al. ............................ | 365/185.17 |
| 5,682,350 | 10/1997 | Lee et al. ....................... | 365/185.17 X |
| 5,729,491 | 3/1998 | Kim et al. ............................. | 365/185.17 |
| 5,748,329 | 5/1998 | Lee ........................................ | 365/185.17 |

*Primary Examiner*—Do Hyun Yoo
*Attorney, Agent, or Firm*—Nikaido, Marmelstein, Murray & Oram LLP

[57] ABSTRACT

A non-volatile semiconductor memory device includes a string of memory cells provided for units of a predetermined information storage region and having a plurality of rewritable non-volatile memory cells connected in series. The string of memory cells is divided into a plurality of groups of memory cells. The device further includes a plurality of switching elements each connected in parallel with a corresponding one of the divided groups of memory cells, and a control unit for controlling on/off operations of the plurality of switching elements. Owing to this configuration, even if an invalid block occurs, the memory cells can be utilized effectively as a whole without the need of making the whole block unavailable.

6 Claims, 5 Drawing Sheets

SEMICONDUCTOR MEMORY DEVICE HAVING NON-VOLATILE MEMORY CELLS CONNECTED IN SERIES

BACKGROUND OF THE INVENTION

1. Field of the Invention

The present invention relates to a semiconductor memory device having non-volatile memory cells capable of being electrically programmed and erased. More particularly, this invention is concerned with a NAND-type flash memory having a configuration such that a plurality of non-volatile memory cells are connected in series in units of an information storage region having a given size.

2. Description of the Related Art

In recent years, numerous types of flash memories in which information can be electrically programmed and the whole or part of the information can be electrically erased have been developed as mainstay non-volatile semiconductor memory devices. Above all, a NAND-type flash memory is suitable for a large-capacity file system because <1> although the speed of random access is low, the speed of sequential access is high, <2> writing can be carried out in units of a page, that is, a word line (normally, 264 bytes calculated by adding 8 redundant bytes to 256 bytes or 528 bytes calculated by adding 16 redundant bytes to 512 bytes), <3> that erasure can be carried out in units of a smaller block (normally, 16 pages) compared with a general flash memory referred to as a NOR-type flash memory, <4> that the time required for rewriting data is short, and <5> that since the area of a memory cell is small, a large storage capacity can be attained readily. Markets for this kind of NAND-type flash memory are predicted to expand in the future. The NAND-type flash memory is now attracting attention.

FIG. 1 shows part of the configuration of a memory cell array in a NAND-type flash memory that is an example of a prior art. In the drawing, there are shown word lines $WL_1$ to $WL_{16}$ arranged in units of one block (16 pages), and bit lines $BL_1$, $BL_2$, etc. Sixteen non-volatile memory cells (memory cell transistors) ($Q1M_1$ to $Q1M_{16}$ or $Q2M_1$ to $Q2M_{16}$) for storing information are connected in series on each bit line ($BL_1$ or $BL_2$) in units of one block, thus constituting one string of memory cells. One terminal of each string of memory cells $Q1M_1$ to $Q1M_{16}$ or $Q2M_1$ to $Q2M_{16}$ is connected with the bit line $BL_1$ or $BL_2$ via a selection transistor $Q1A_1$ or $Q2A_1$ that responds to the potential on a selection signal line $SL_1$. The other terminal of each string of memory cells is grounded via a selection transistor $Q1A_2$ or $Q2A_2$ that responds to the potential on a selection signal line $SL_2$.

For storing information in a memory cell, the information is stored as data "1" or data "0." Specifically, data "1" is stored by positively charging the floating gate of the memory cell (that is, by setting the threshold voltage of the memory cell transistor into a negative voltage). Data "0" is stored by negatively charging the floating gate of the memory cell (that is, by setting the threshold voltage of the memory cell transistor to a positive voltage).

For reading information from a memory cell, first, the potentials on the selection signal lines $SL_1$ and $SL_2$ are driven high, and the selection transistors $Q1A_1$, $Q2A_1$, $Q1A_2$, and $Q2A_2$ are all turned on. Consequently, the strings of memory cell $Q1M_1$ to $Q1M_{16}$ and $Q2M_1$ to $Q2M_{16}$ are connected on the bit lines $BL_1$ and $BL_2$ and to the ground. Thereafter, 0 V is applied to the control gate of a memory cell from which information should be read (that is, a selected word line), and a high-level voltage is applied to the control gates of the other memory cells (that is, non-selected word lines).

Assuming that information stored in a selected memory cell (=memory cell transistor) is data "1," even when the voltage of the control gate is 0 V, the memory cell transistor is turned on. A cell current flows into an associated bit line. By contrast, assuming that information stored in a selected memory cell is data "0," since the threshold voltage of the memory cell transistor is positive, when the voltage of the control gate is 0 V, the memory cell transistor is turned off. No cell current flows into the bit line. Meanwhile, a high-level voltage is applied to all the control gates of non-selected memory cells. Irrespective of stored information, all the non-selected memory cell transistors are on. A cell current flows into the bit line.

In other words, when information is read, a sense amplifier is used to detect whether or not a selected memory cell causes a cell current to flow into an associated bit line. Thereby, it can be determined whether information stored in the selected memory cell is data "1" or data "0."

As mentioned above, in the NAND-type flash memory, writing or reading is carried out in units of a page (=word line), and erasure is carried out in units of a block (=a plurality of pages). Since a plurality of memory cells are connected in series on each bit line in units of a block, if even one bit location (=one memory cell) within one block or one page is faulty, the operations of memory cells other than the faulty memory cell are affected adversely.

For example, in the configuration shown in FIG. 1, assume that one ($Q1M_2$) of the 16 memory cells (=memory cell transistors) $Q1M_1$ to $Q1M_{16}$ connected in series on the bit line $BL_1$ is brought to a non-functional state. In this case, when information is read from the nonfunctional memory cell $Q1M_2$, since the memory cell transistor is off, no cell current flows into the bit line $BL_1$. Irrespective of original stored information, data "0" is identified.

When an attempt is made to read information from any of the other memory cells $Q1M_1$ and $Q1M_3$ to $Q1M_{16}$ contained in the same string of memory cells as the broken memory cell $Q1M_2$, since the broken memory cell $Q1M_2$ is off, a current flow is cut off. Even in this case, irrespective of original stored information, data "0" is identified.

A block including a faulty memory cell is a block judged as an unavailable block at the time of delivery of a product, and is, for example, referred to as an "invalid block." After a fault is discovered, access to such an invalid block is inhibited. This is because, as mentioned above, since a NAND-type flash memory is programmed or read in units of a page and erased in units of a block, access to an invalid block involves a string of memory cells in which a fault occurs.

As mentioned above, the NAND-type flash memory has a problem that since the NAND-type flash memory includes strings of memory cell each having a plurality of memory cells connected in series, when one bit location (=one memory cell) in a string of memory cells fails, even if the other memory cells contained in the string of memory cells functions normally, the whole block containing the defective memory cell becomes unavailable. In other words, a majority of normal memory cells other than a minority of defective memory cells (which may be one defective memory cell) among all the memory cells arranged in a limited information storage region are wasted. From the viewpoint of effective utilization of memory cells, there is room for improvement.

SUMMARY OF THE INVENTION

An object of the present invention is to provide a non-volatile semiconductor memory device in which, even if an invalid block occurs, the whole of the block need not be made unavailable but memory cells can be utilized effectively as a whole.

According to the present invention, there is provided a non-volatile semiconductor memory device including: a string of memory cells provided for units of a predetermined information storage region and having a plurality of rewritable non-volatile memory cells connected in series, said string of memory cells being divided into a plurality of groups of memory cells; a plurality of switching elements each connected in parallel with a corresponding one of said divided groups of memory cells; and control means for controlling on/off operations of said plurality of switching elements.

According to the configuration of a non-volatile semiconductor memory device of the present invention, if any memory cell contained in a string of memory cells connected in series fails, only a switching element associated with a group of memory cells containing the memory cell is turned on by a control means. Thus, the group of memory cells is bypassed, and the use of the string of memory cells can be continued.

In other words, the bypassed group of memory cells within a string of memory cells is made unavailable, but the remaining group of memory cells is available. Compared with the prior art in which a string of memory cells in question (a block containing the string of memory cells) is made entirely unavailable, memory cells can be utilized effectively as a whole.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Figure 2:
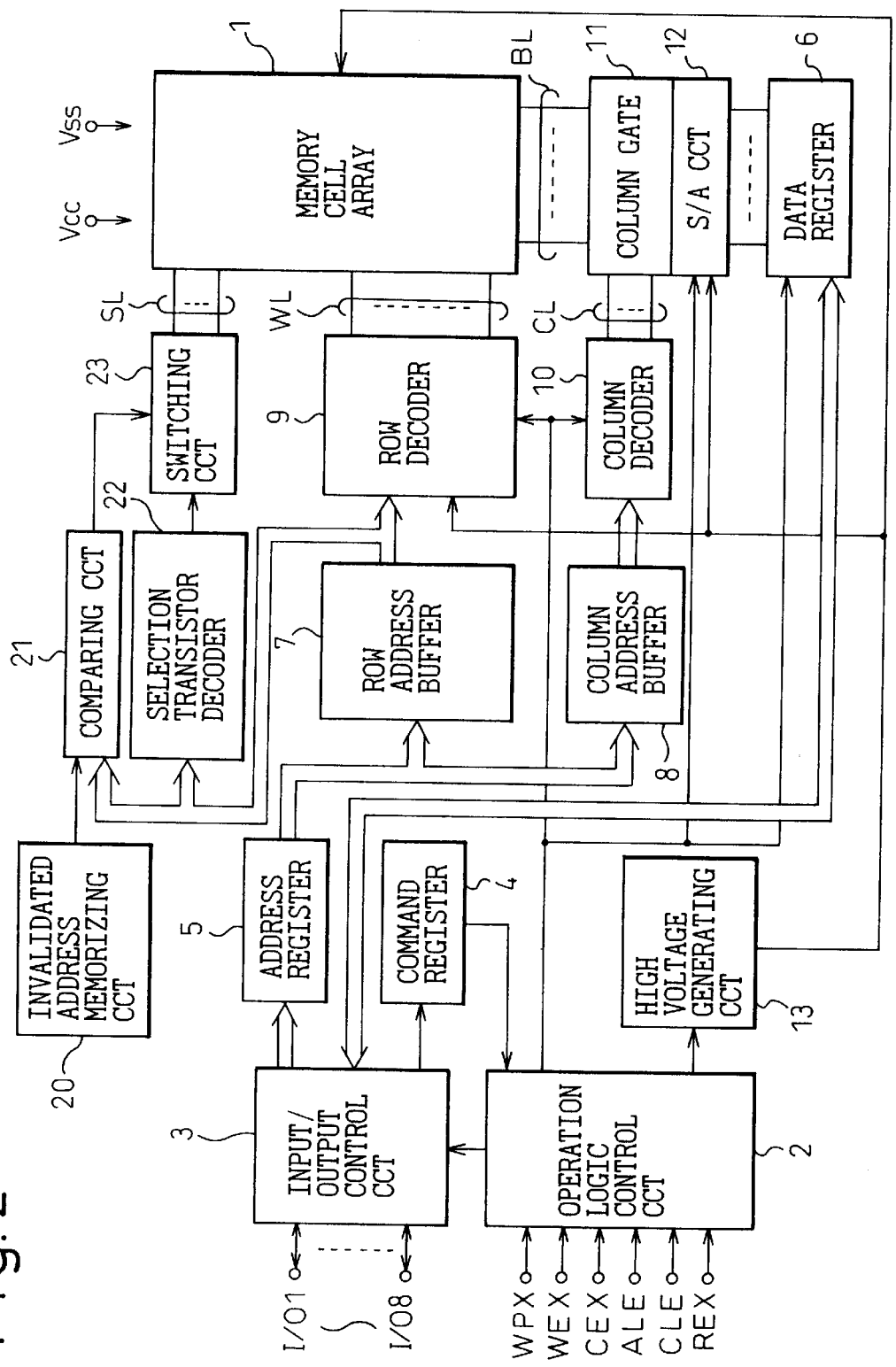
FIG. 2 is a block diagram schematically showing the overall configuration of an NAND-type flash memory in accordance with an embodiment of the present invention.

FIG. 2 schematically shows the overall configuration of a NAND-type flash memory in accordance with an embodiment of the present invention.

In the drawing, there are shown input/output terminals I/O1 to I/O8 for fetching an operation command or an address signal and for writing data into the inside of the device or outputting data read from a memory cell inside the device to outside. Also shown are control signals WPX, WEX, CEX, ALE, CLE, and REX for controlling the operations of the device. Specifically, the control signals WPX, WEX, CEX, ALE, CLE, and REX are a write-protect signal, write-enable signal, chip-enable signal, address latch-enable signal, command latch-enable signal, and read-enable signal respectively. There are also shown a high-potential supply voltage Vcc (normally, 5 V or 3.3 V) and a low-potential supply voltage Vss (normally 0 V). These voltages are supplied to circuits inside the device.

Also shown is a memory cell array 1 having rewritable non-volatile memory cells (memory cell transistors) arranged along a plurality of word lines WL and a plurality of bit lines BL which are laid out in the form of a matrix. In this embodiment, 16 memory cells are connected in series on each bit line in units of one block (16 pages), thus constituting a string of memory cells. In the memory cell array 1, a plurality of selection signal lines SL are arranged in a direction in which they become parallel to the word lines.

Also shown are an operation logic control circuit 2 for controlling the operations of the circuits inside the device in response to the control signals (WPX, WEX, CEX, ALE, CLE, and REX), an input/output control circuit 3 for controlling input or output of various signals or data through the input/output terminals I/O1 to I/O8, a command register 4 for temporarily storing an operation command input via the input/output control circuit 3, an address register 5 for temporarily storing an address signal input via the input/output control circuit 3, and a data register 6 for temporarily storing external writing data input via the input/output control circuit 3, and data read from a memory cell.

Also shown are a row address buffer 7 for buffering a row address contained in an address signal input via the address register 5, a column address buffer 8 for buffering a column address contained in the address signal input via the address register 5, a row decoder 9 for decoding the row address sent from the row address buffer 7 and selecting any of a plurality of word lines WL, a column decoder 10 for decoding the column address sent from the column address buffer 8 and selecting any of a plurality of column lines CL, a column gate 11 that when any column line is selected, connects a bit line corresponding to the column line with an associated data line (not shown), and sense amplifier (S/A) circuits 12 each sensing and amplifying data read onto each data line.

Also shown is a high-voltage generating circuit 13 for generating a high voltage employed inside the device (a high voltage used to write data, a high voltage used to erase data, or a high voltage used for verification to check if writing or erasure has been performed fully on a memory cell during data writing or erasure). A generated high voltage is supplied to a selected word line via the row decoder 9, to the S/A circuit 12 associated with a selected bit line, and to the memory cells within the memory cell array 1.

The input/output control circuit 3, data register 6, row decoder 9, column decoder 10, S/A circuits 12, and high-voltage generating circuit 13 function under the control of the operation logic control circuit 2.

The write-protect signal WPX is used to forcibly disable writing or erasure. Specifically, although the signal WPX is driven high for use, when an input signal is uncertain because, for example, a power supply is broken, the signal WPX is driven low in order to reset the operation of the high-voltage generating circuit 13. Stored data is thus protected from an unexpected operation. The write-enable signal WEX is used to fetch various signals or data into the inside of the device through the input/output terminals I/O1 to I/O8. The chip-enable signal CEX is used to specify a mode of the device. Specifically, when the signal CEX is driven high during reading, the device is brought to a standby mode in which a power consumption is low. When writing or erasure is in progress, either the high-level or low-level state is permitted. The address latch-enable signal ALE is used to control fetching of an address signal into the address register 5 and fetching of writing data into the data register 6. Specifically, when the signal ALE is driven high at the leading or trailing edge of the write-enable signal WEX, data is fetched as an address signal into the address register 5 through the input/output terminals I/O1 to I/O8. The command latch-enable signal CLE is used to control fetching of an operation command into the command register 4. That is to say, when the signal CLE is driven high at the leading ortrailing edge of the write-enable signal WEX, data is fetched as an operation command into the command register 4 through the input/output terminals I/O1 to I/O8. The read-enable signal REX is used to output data read from memory cells serially to outside. Specifically, when the signal REX is driven low, after a given period of time elapses, data to be output through the input/output terminals I/O1 to I/O8 is finalized. When the signal REX is driven high, an internal column address counter (not shown) is incremented by one.

The foregoing components and operations are substantially identical to those in a normal NAND-type flash memory.

The NAND-type flash memory of this embodiment includes: in addition to the foregoing components, an invalidated address memorizing circuit 20 in which if any memory cell of each string of memory cells having 16 memory cells connected in series fails, the address of the memory cell is stored using, for example, a fuse; a comparing circuit 21 for comparing a row address input via the row address buffer 7 (that is, a row address designated externally) with the address stored in the invalidated address memorizing circuit 20; a decoder 22 for selecting a selection signal line within the memory cell array 1 on which a selection transistor (not shown) that should be driven is connected; and a switching circuit 23 for connecting a selection signal line selected by the decoder 22 according to the result of comparison performed by the comparing circuit 21.

The comparing circuit 21 compares an externally-designated address with an address stored in the invalidated address memorizing circuit 20 (that is, the address of any memory cell of a string of memory cells in which a fault occurs). If both the addresses disagree with each other, a low-level signal is output. If both the addresses agree with each other, a high-level signal is output.

When an invalidated address is stored in the invalidated address memorizing circuit 20, whether or not a memory cell is faulty is detected during, for example, a verification check accompanying data erasure or a parity check accompanying data reading.

Figure 3:
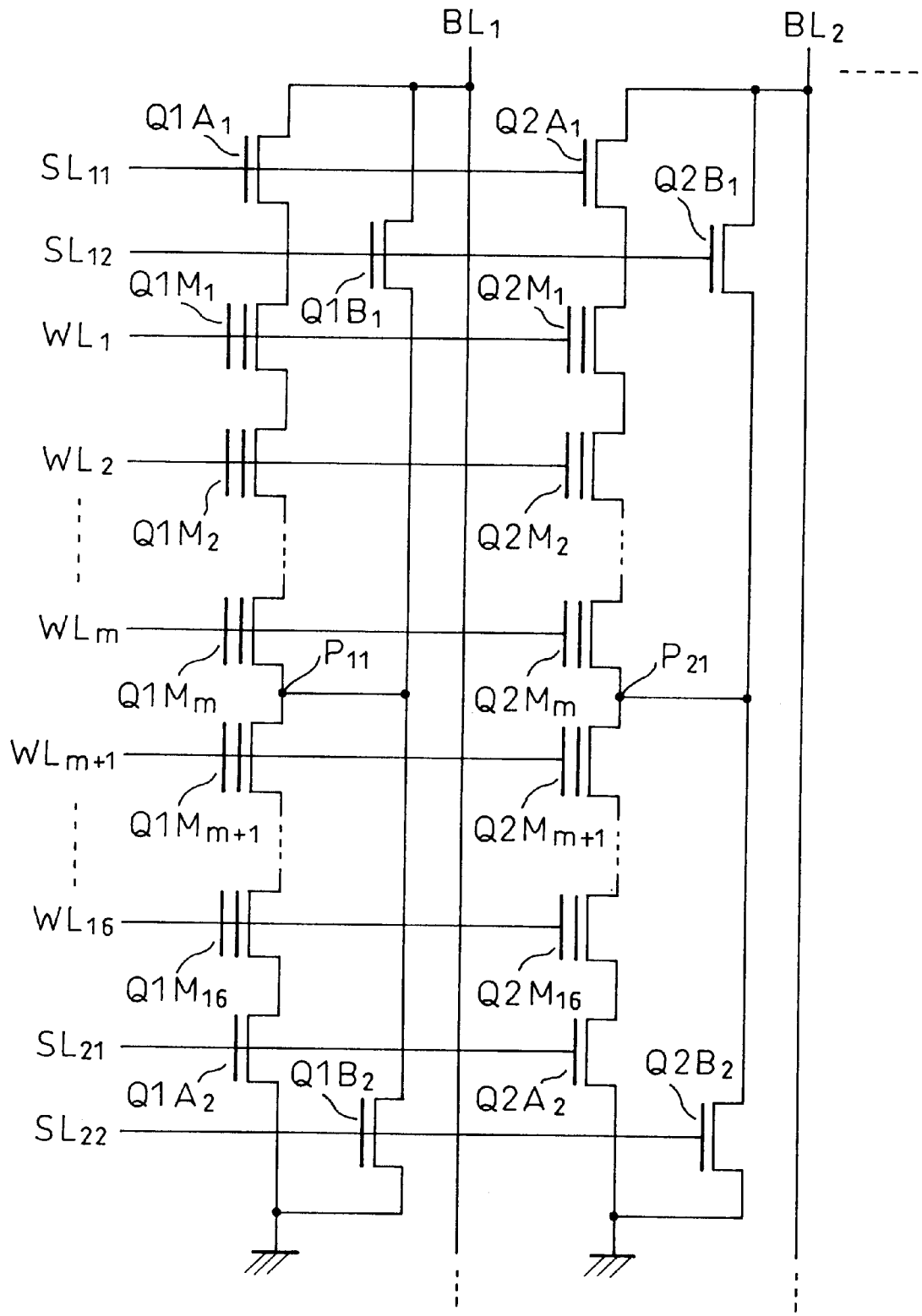
FIG. 3 is a circuit diagram showing part of the configuration of a memory cell array shown in FIG. 2.

The FIG. 3 shows part of the configuration of the memory cell array 1.

Figure 1:
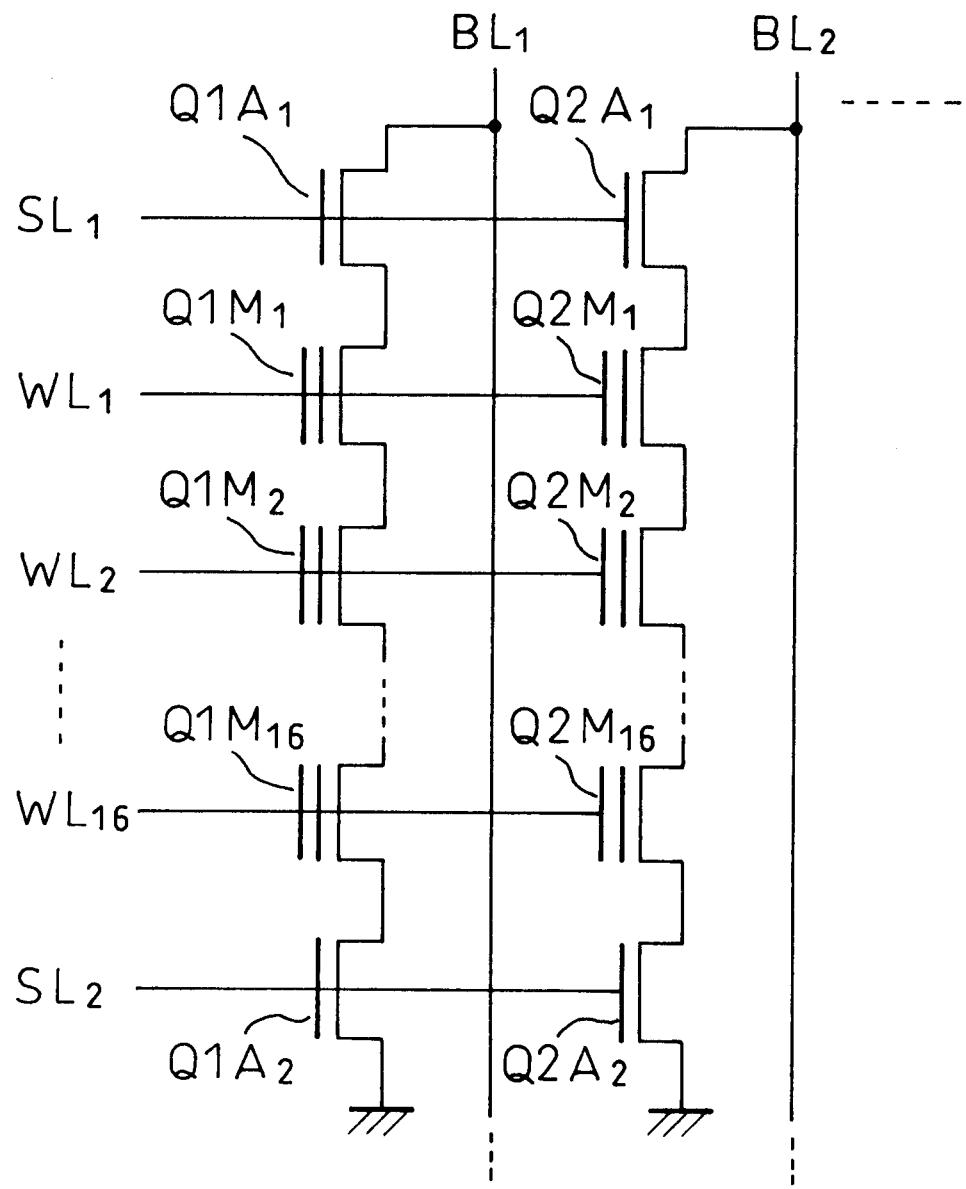
FIG. 1 is a circuit diagram showing part of the configuration of a memory cell array in an NAND-type flash memory which is an example of a prior art.

The fundamental components are identical to those in the one of the prior art shown in FIG. 1. That is to say, 16 non-volatile memory cells $Q1M_1$ to $Q1M_{16}$ or $Q2M_1$ to $Q2M_{16}$ are connected in series on each bit line $BL_1$ or $BL_2$ in units of one block (16 pages=16 word lines $WL_1$ to $WL_{16}$), thus constituting one string of memory cells. One terminal of each of the strings of memory cells $Q1M_1$ to $Q1M_{16}$ and $Q2M_1$ to $Q2M_{16}$ is connected with a bit line $BL_1$ or $BL_2$, respectively, via selection transistors $Q1A_1$ and $Q2A_1$, respectively, which respond to the potential on a selection signal line SL11. The other terminals thereof are grounded via selection transistors $Q1A_2$ and $Q2A_2$ respectively which respond to the potential on a selection signal line $SL_{21}$.

In this embodiment, in addition to the foregoing components, selection transistors $Q1B_1$ and $Q2B_1$, that respond to the potential on a selection signal line $SL_{12}$, are connected between dividing points $P_{11}$ and $P_{21}$ at which the strings of memory cells are each divided into two groups of memory cells, and the bit lines $BL_1$ and $BL_2$, and selection transistors $Q1B_2$ and $Q2B_2$ that respond to the potential on the selection signal line $SL_{22}$ are connected between the dividing points $P_{11}$ and $P_{21}$ and the ground. In short, the selection transistors $Q1B_1$, $Q1B_2$, $Q2B_1$, and $Q2B_2$ are connected in parallel with associated groups of memory cells in order to bypass the groups of divided memory cells.

In the foregoing configuration, when the selection transistor connected in series with each group of divided memory cells or the selection transistor connected in parallel therewith are driven over the respective selection signal lines so that when one of the selection transistors is on, the other transistor is off. Taking for instance a group of m memory cells $Q1M_1$ to $Q1M_m$ connected on the bit line $BL_1$, the selection transistors $Q1A_1$ and $Q1B_1$ are controlled according to the voltage levels of the associated selection signal lines $SL_{11}$ and $SL_{12}$ so that when the selection transistor $Q1A_1$ is on (or off), the selection transistor $Q1B_1$ is off (or on).

Figure 4:
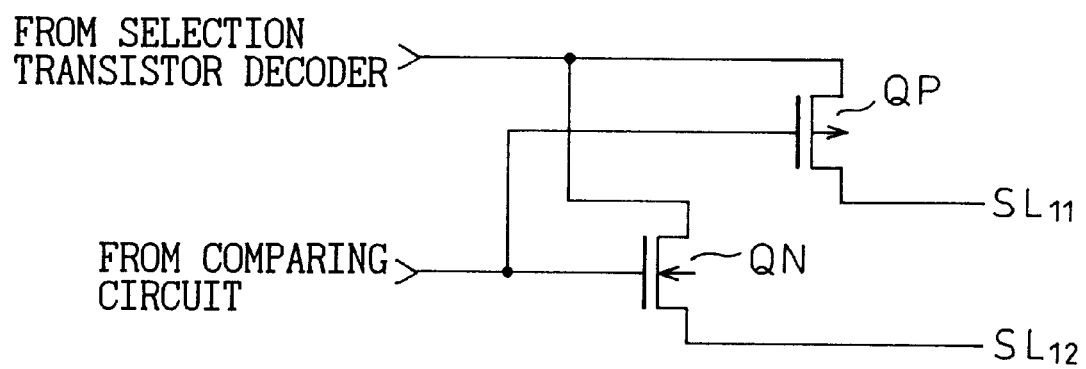
FIG. 4 is a circuit diagram showing an example of the circuitry of a switching circuit shown in FIG. 2.

The aforesaid switching circuit 23 is included for controlling the voltage levels of the selection signal lines. FIG. 4 shows an example of the circuitry of the switching circuit 23.

As shown in FIG. 4, the switching circuit 23 includes a p-channel transistor QP that is connected between an output terminal of the selection transistor decoder and the selection signal line $SL_{11}$ and is turned on or off in response to an output of the comparing circuit, and an n-channel transistor QN that is connected between the output terminal of the selection transistor decoder and the selection signal line $SL_{12}$ and turned on or off in response to an output of the comparing circuit.

In the foregoing circuitry, when an output of the comparing circuit is low (that is, an externally-designated address disagrees with an address stored in the invalidated address memorizing circuit 20), the n-channel transistor QN is turned off and the p-channel transistor QP is turned on. The selection signal line $SL_{12}$ is therefore disconnected from the selection transistor decoder, and an output of the selection transistor decoder is placed on the selection signal line $SL_{11}$. Consequently, the selection transistors ($Q1A_1$ and $Q2A_1$ in FIG. 3) connected on the selection signal line $SL_{11}$ are turned on, while the selection transistors ($Q1B_1$ and $Q2B_1$ in FIG. 3) connected on the selection signal line $SL_{12}$ are turned off.

In contrast, when an output of the comparing circuit is high (that is, an externally-designated address agrees with an address stored in the invalidated address memorizing circuit 20), the p-channel transistor QP is turned off and the n-channel transistor QN is turned on. The selection signal line $SL_{11}$ is therefore disconnected from the selection transistor decoder, and an output of the selection transistor decoder is placed on the selection signal line $SL_{12}$. Consequently, the selection transistors ($Q1B_1$ and $Q2B_1$ in FIG. 3) connected on the selection signal line $SL_{12}$ are turned on, while the selection transistors ($Q1A_1$ and $Q2A_1$ in FIG. 3) connected on the selection signal line $SL_{11}$ are turned off.

In the example shown in FIG. 4, for brevity's sake, only the components relevant to the selection signal lines $SL_{11}$ and $SL_{12}$ are shown. The components relevant to the other selection signal lines $SL_{21}$ and $SL_{22}$ can be realized using the same circuitry.

Next, the operation and effect of the NAND-type flash memory in accordance with this embodiment will be described with reference to FIG. 3. For brevity's sake, only the circuitry relevant to the bit line $BL_1$ will be discussed as an example.

In the circuitry, for example, assume that any memory cell of a group of memory cells (m memory cells $Q1M_1$ to $Q1M_m$) located between the dividing point $P_{11}$ and the bit line $BL_1$ fails.

The prior art (See-FIG. 1) has the drawback that if one bit location (one memory cell) among memory cells connected in series is faulty, the whole of the block containing the defective memory cell is unavailable.

In contrast, according to this embodiment, when the selection transistor $Q1A_1$ is turned off and the selection transistor $Q1B_1$ is turned on, the group of memory cells $Q1M_1$ to $Q1M_m$ in which a fault occurs is disconnected from the bit line $BL_1$. Besides, the bit line $BL_1$ can be electrically connected with the dividing point $P_{11}$ via the selection transistor $Q1B_1$. In this case, the selection transistor $Q1A_2$ remains on and the selection transistor $Q1B_2$ remains off.

The bit line $BL_1$ is thus connected with the dividing point $P_{11}$ while bypassing the group of memory cells $Q1M_1$ to $Q1M_m$ in which a fault occurs. The other group of memory cells $Q1M_{m+1}$ to $Q1M_{16}$ that functions normally can be kept available as it is. In other words, the group of memory cells $Q1M_1$ to $Q1M_m$, which are bypassed, out of the string of memory cells $Q1M_1$ to $Q1M_{16}$ is made unavailable, while the group of remaining memory cells $Q1M_{m+1}$ to $Q1M_{16}$ are available. The memory cells can therefore be utilized effectively as a whole.

Likewise, if a fault occurs in any memory cell of the group of memory cells $Q1M_{m+1}$ to $Q1M_{16}$ located between the dividing point $P_{11}$ and ground, the selection transistor $Q1A_2$ is turned off and the selection transistor $Q1B_2$ is turned on. Thereby, the group of memory cells $Q1M_{m+1}$ to $Q1M_{16}$ in which a fault occurs is bypassed, and the other group of memory cells $Q1M_1$ to $Q1M_m$ that functions normally is kept available as it is. In this case, the selection transistor $Q1A_1$ remains on and the selection transistor $Q1B_1$ remains off.

As mentioned above, according to the configuration of the NAND-type flash memory of this embodiment, even if an invalid block that is made unavailable because a fault is detected, connection switching of memory cells is controlled so that a group of memory cells containing a faulty memory cell is bypassed. Consequently, although bypassed pages are unavailable, a remaining majority of pages are available. Compared with the prior art in which the whole block becomes unavailable, the memory cells can be utilized effectively as a whole.

Figure 5:
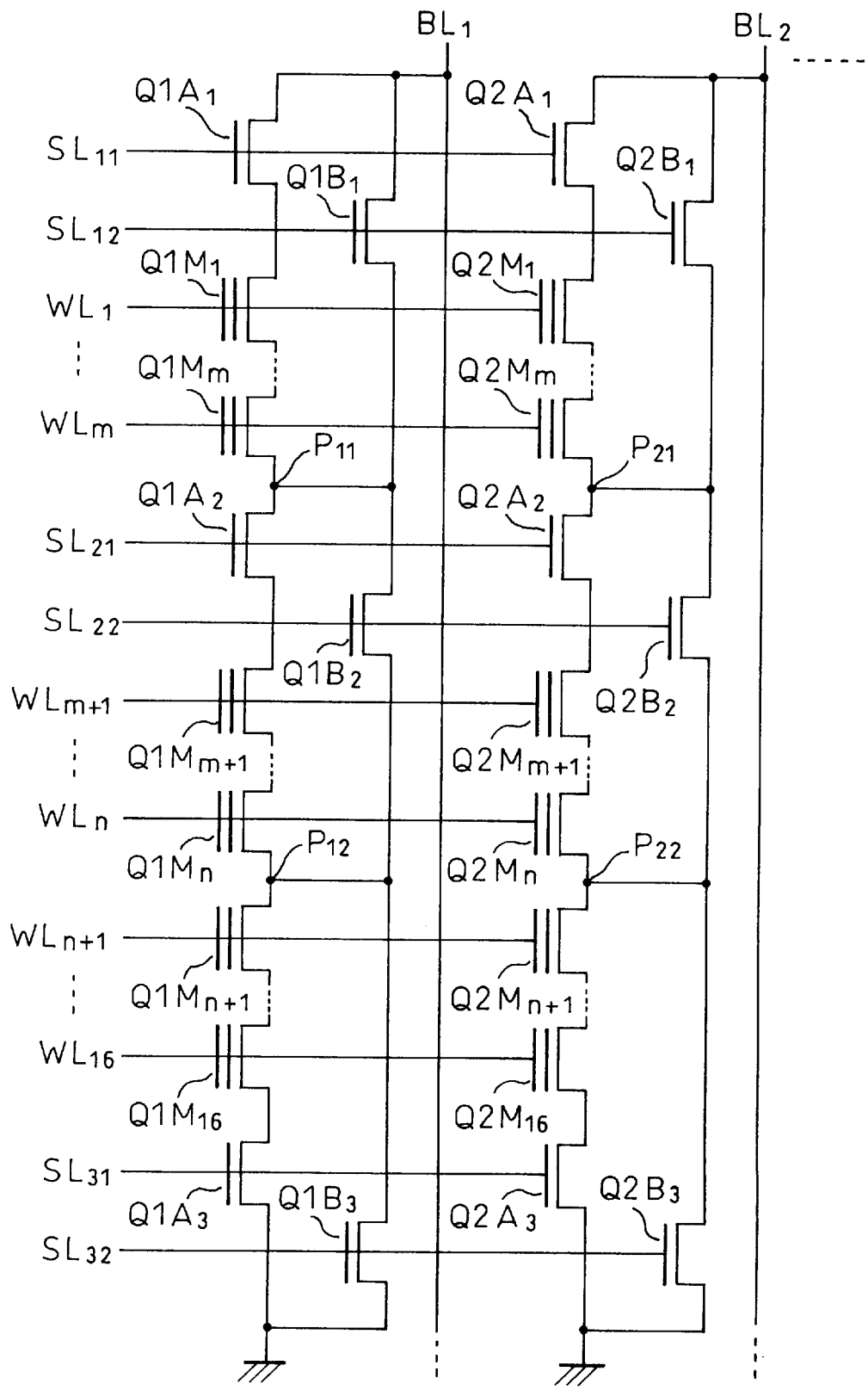
FIG. 5 is a circuit diagram showing part of the configuration of a memory cell array in another embodiment of the present invention.

In the aforesaid embodiment, the description has been made by taking for instance the example of a configuration in which one string of memory cells is divided into two groups of memory cells. The number of groups of memory cells into which one string of memory cells is divided is not limited to two. For example, one string of memory cells may be divided into three groups of memory cells. FIG. 5 shows an example of a configuration in which one string of memory cells is divided into three groups of memory cells.

An embodiment shown in FIG. 5 is identical to the embodiment shown in FIG. 3 in terms of the fundamental configuration (arrangement of memory cells). In this embodiment, since one string of memory cells is divided into three groups of memory cells, there are differences described below from the embodiment shown in FIG. 3.

To begin with, there are two dividing points $P_{11}$ and $P_{12}$ ($P_{21}$ and $P_{22}$) for dividing each string of memory cells $Q1M_1$ to $Q1M_{16}$ ($Q2M_1$ to $Q2M_{16}$). A selection transistor $Q1B_1$ ($Q2B_1$) responding to the potential on a selection signal line $SL_{12}$ is connected between a bit line $BL_1$ ($BL_2$) and one dividing point $P_{11}$ ($P_{21}$). A selection transistor $Q1B_2$ ($Q2B_2$) responding to the potential on a selection signal line $SL_{22}$ is connected between one dividing point $P_{11}$ ($P_{21}$) and the other dividing point $P_{12}$ ($P_{22}$). A selection transistor $Q1B_3$ ($Q2B_3$) responding to the potential on a selection signal line $SL_{32}$ is connected between the other dividing point $P_{12}$ ($P_{22}$) and ground. In short, the selection transistors $Q1B_1$, $Q1B_2$, $Q1B_3$, $Q2B_1$, $Q2B_2$, and $Q2B_3$ are connected in parallel with associated groups of memory cells in order to bypass the groups of divided memory cells.

Moreover, selection transistors $Q1A_1$, $Q1A_2$, $Q1A_3$, $Q2A_1$, $Q2A_2$, $Q2A_3$ are connected in series with the groups of memory cells. Herein, the selection transistor $Q1A_1$ ($Q2A_1$) responds to the potential on the selection signal line $SL_{11}$, the selection transistor $Q1A_2$ ($Q2A_2$) responds to the potential on the selection signal line $SL_{21}$, and the selection transistor $Q1A_3$ ($Q2A_3$) responds to the potential on the selection signal line $SL_{31}$.

As in the embodiment shown in FIG. 3, the selection transistor connected in series with each group of memory cells and the selection transistor connected in parallel therewith are driven over the associated selection signal lines so that when one of the selection transistors is on, the other thereof is off. Taking for instance a group of m memory cells $Q1M_1$ to $Q1M_m$ connected on the bit line $BL_1$, the selection transistors $Q1A_1$ and $Q1B_1$ are controlled according to the voltage levels of the associated selection signal lines $SL_{11}$ and $SL_{12}$ so that when the selection transistor $Q1A_1$ is on (or off), the selection transistor $Q1B_1$ is off (or on). For controlling the voltage levels of the selection signal lines, a switching circuit, such as, for example, the one shown in FIG. 4, is employed.

The operation and effect exerted by the circuitry of this embodiment will be easily inferred from the description of the operation and effect exerted by the circuitry in the embodiment shown in FIG. 3. The description of the operation and effect will therefore be omitted.

However, in this embodiment, if a fault occurs in a group of memory cells located between the bit line $BL_1$ ($BL_2$) and dividing point $P_{11}$ ($P_{21}$), the selection transistor $Q1A_1$ ($Q2A_1$) associated with the group of memory cells is turned off, and the selection transistor $Q1B_1$ ($Q2B_1$) associated therewith is turned on. At this time, the selection transistors $Q1A_2$ and $Q1A_3$ ($Q2A_2$ and $Q2A_3$) associated with the other groups of memory cells remain on, and the selection transistors $Q1B_2$ and $Q1B_3$ ($Q2B_2$ and $Q2B_3$) associated therewith remain off. If a fault occurs in a group of memory cells located between two dividing points $P_{11}$ ($P_{21}$) and $P_{12}$ ($P_{22}$), the selection transistor $Q1A_2$ ($Q2A_2$) associated with the group of memory cells is turned off and the selection transistor $Q1B_2$ ($Q2B_2$) associated therewith is turned on. At this time, the selection transistors $Q1A_1$ and $Q1A_3$ ($Q2A_1$ and $Q2A_3$) associated with the other groups of memory cells remain on and the selection transistors $Q1B_1$ and $Q1B_3$ ($Q2B_1$ and $Q2B_3$) associated therewith remain off. If a fault occurs in a group of memory cells located between the dividing point $P_{12}$ ($P_{22}$) and ground, the selection transistor $Q1A_3$ ($Q2A_3$) associated with the group of memory cells is turned off and the selection transistor $Q1B_3$ ($Q2B_3$) associated therewith is turned on. At this time, the selection transistors $Q1A_1$ and $Q1A_2$ ($Q2A_1$ and $Q2A_2$) associated with the other groups of memory cells remain on and the selection transistors Q1B$_1$ and Q1B$_2$ (Q2B$_1$ and Q2B$_2$) associated therewith remain off.

What is claimed is:

1. A non-volatile semiconductor memory device comprising:
    a string of memory cells having a plurality of rewritable non-volatile memory cells connected in series, said string of memory cells being divided into a plurality of groups of memory cells;
    a plurality of switching elements each connected in parallel with a corresponding one of said divided groups of memory cells, at least one terminal of each of said plurality of switching elements being connected to an intermediate node of said string of memory cells so as to form a bypass for said corresponding one of said divided groups of memory cells; and
    control means for controlling on/off operations of said plurality of switching elements.

2. The non-volatile semiconductor memory device as set forth in claim 1, further comprising a plurality of switching elements each connected in series with a corresponding one of said groups of divided memory cells, wherein on/off operations of said plurality of switching elements each connected in series with said corresponding one of said groups of divided memory cells are controlled by said control means.

3. The non-volatile semiconductor memory device as set forth in claim 2, wherein said switching element connected in series with each group of memory cells is formed with a first selection transistor, and said switching element connected in parallel with each group of memory cells is formed with a second selection transistor.

4. The non-volatile semiconductor memory device as set forth in claim 3, wherein if a fault occurs in any memory cell of said string of memory cells, said control means turns off said first selection transistor associated with a group of memory cells containing the memory cell, and turns on said second selection transistor associated with the group of memory cells.

5. The non-volatile semiconductor memory device as set forth in claim 4, wherein said control means comprises a circuit that, if a fault occurs in any memory cell of said string of memory cells, stores the address of the memory cell, a circuit for comparing the stored address with an externally-designated address, and a circuit for switching selection signal lines, over which the on/off operations of said first and second selection transistors are controlled, according to the result of the comparison.

6. A non-volatile semiconductor memory device comprising:
    a bit line;
    a plurality of rewritable non-volatile memory cells connected in series between the bit line and a second node via a first node;
    a first switch operatively connected between the bit line and the first node, in response to a first control signal;
    a second switch operatively connected between the first node and the second node, in response to a second control signal; and
    a control circuit outputting the first or second control signals, when one of said plurality of rewritable non-volatile memory cells is defective.

* * * * *